United States Patent [19]

Petersen et al.

[11] Patent Number: 5,087,893
[45] Date of Patent: Feb. 11, 1992

[54] RF DRIVEN GATE BIAS

[75] Inventors: Michael W. Petersen; Clark D. Fischbach, both of Hoffman Estates, Ill.

[73] Assignee: Motorola, Inc., Schaumburg, Ill.

[21] Appl. No.: 452,172

[22] Filed: Dec. 18, 1989

[51] Int. Cl.$^5$ .............................................. H03G 3/30
[52] U.S. Cl. ................................... 330/296; 330/136; 330/140; 455/127
[58] Field of Search ............... 330/123, 136, 140, 277, 330/296, 297; 333/116, 128; 455/127; 323/299, 301, 303

[56] References Cited

U.S. PATENT DOCUMENTS 4,465,980  8/1984  Huang et al. .................. 330/136 X

FOREIGN PATENT DOCUMENTS 1568513  5/1980  United Kingdom ................ 330/136

Primary Examiner—Steven Mottola
Attorney, Agent, or Firm—John W. Hayes

[57] ABSTRACT

A circuit for providing DC bias voltage to an RF power amplifier transistor where the DC bias voltage is derived from the RF input signal.

6 Claims, 2 Drawing Sheets

RF DRIVEN GATE BIAS

TECHNICAL FIELD

This invention relates generally to RF power amplifiers and in particular to a circuit for providing bias voltage to an RF power amplifier stage, and is more particularly directed to a circuit that derives RF power amplifier bias voltage from an RF input signal.

BACKGROUND OF THE INVENTION

Radio frequency (RF) power amplifiers, which are used to amplify RF signals to obtain desired transmitter output power, are necessary components of most RF communications equipment. As is well known, RF power amplifier stages must be provided with a DC (direct current) bias voltage during normal operation in order to establish an operating point. Because application of bias voltage to an RF amplifier stage in the absence of an RF input signal often causes instability, bias voltage is normally applied only when it is desired to transmit an information signal. Thus, switching circuitry responsive to a transmitter control signal is generally required. The need for this control circuitry and signal lines for the distribution of the transmitter control signal adds complexity and cost to RF amplifier designs.

RF amplifier stages can also demonstrate instability when a high level of bias voltage is switched to the RF amplifier stage before the RF input signal rises to its final value. Allowing the bias voltage to be controlled or driven by the RF input signal leads to greater RF amplifier stability, particularly at low input signal levels.

Accordingly, a need arises for an RF amplifier biasing technique that limits parts count and complexity while helping to ensure amplifier stability.

SUMMARY OF THE INVENTION

According to the invention, a circuit is provided that supplies bias voltage to at least one amplifier transistor having an RF input signal. The circuit comprises an RF power divider for providing a sample of the RF input signal, a rectifier for converting the sample into a DC voltage, and a regulator responsive to the rectifier for providing the bias voltage, and limiting amplitude to ensure a relatively constant bias voltage over a relatively wide range of RF input signal amplitudes.

DETAILED DESCRIPTION OF THE INVENTION

Figure 1:
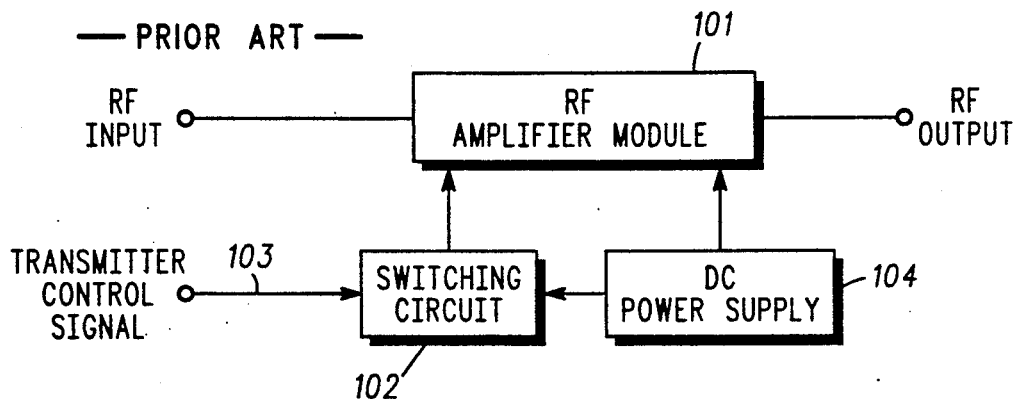
FIG. 1 depicts an RF amplifier bias control technique of the prior art.

FIG. 1 depicts, via block diagram, the switching and control circuitry necessary to provide proper bias voltage to an RF amplifier using prior art techniques. Since it is only desired to bias the RF amplifier module (101) when the transmitter is active, a switching circuit (102) is employed to switch DC bias voltage provided by a DC power supply (104) in response to a transmitter control signal (103).

Figure 2:
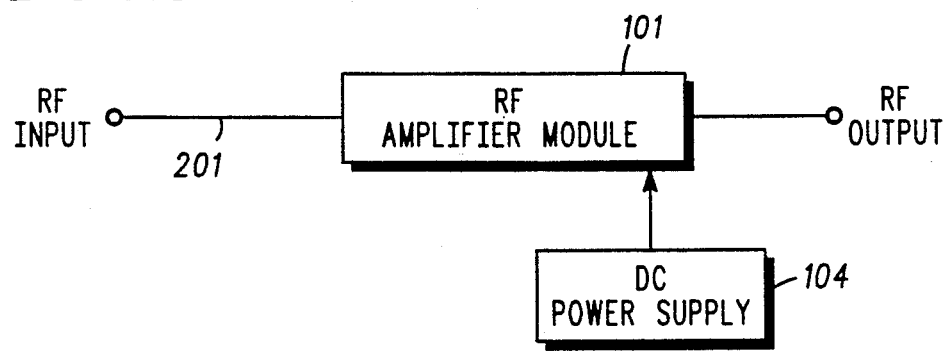
FIG. 2 illustrates the simplification of control and switching circuitry resulting from use of the present invention.

FIG. 2 illustrates the relative economy in parts count and reduction of complexity achievable through use of the RF driven gate bias circuit of the present invention. Since proper DC bias voltage for the RF amplifier module (101) is obtained directly from the RF input signal (201), there is no need for additional switching circuitry.

Figure 3:
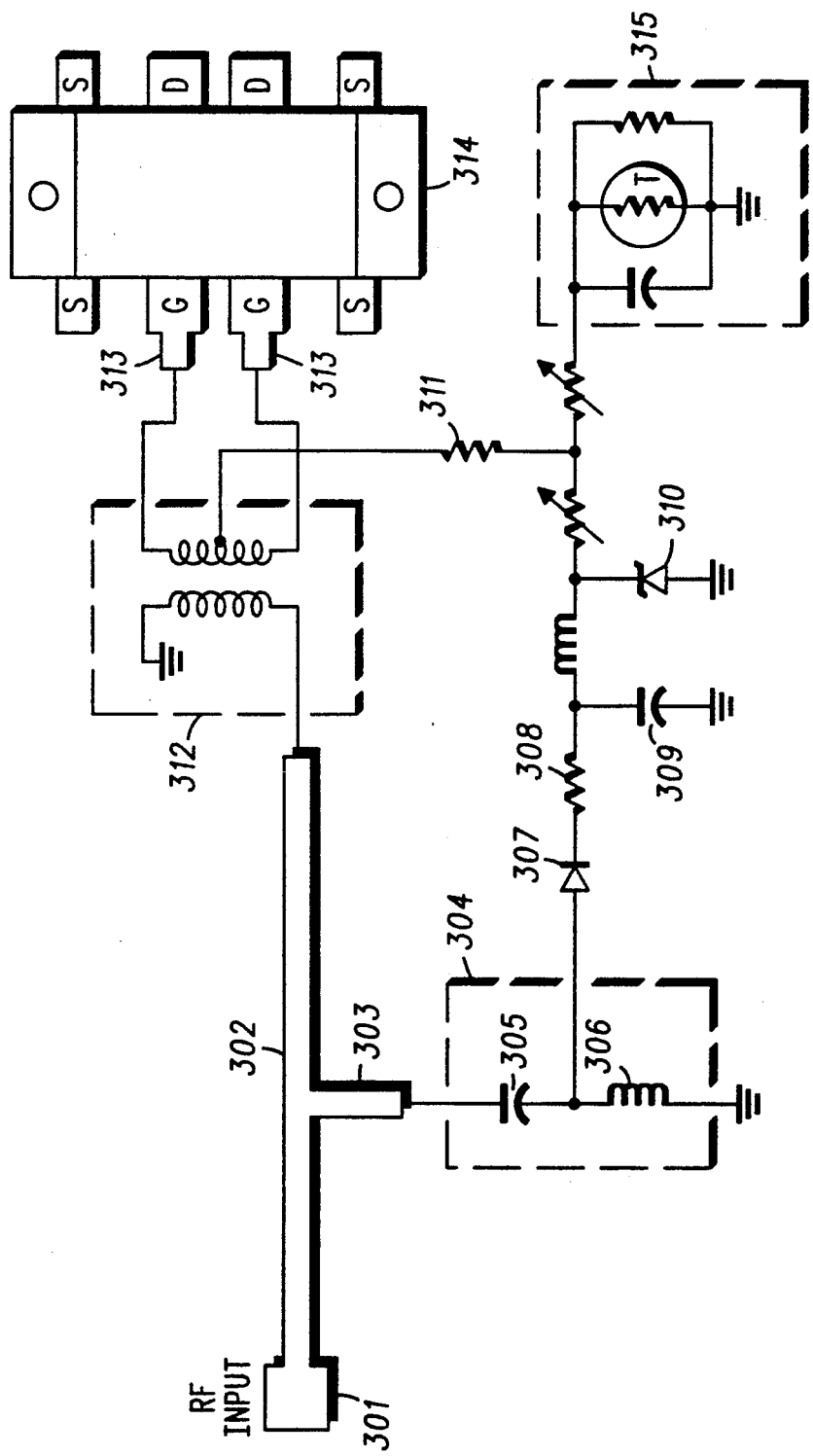
FIG. 3 is a schematic diagram of the RF driven gate bias circuit of the present invention.

FIG. 3 is a schematic diagram of the RF driven gate bias circuit. An RF input signal (301) is applied to the input of a transmission line (302). The transmission line (302) is equipped with a tap (303) designed to divert a small amount of RF power. The tapped transmission line acts as a power splitter or power divider which, as is known in the art, provides a plurality of outputs derived from a single input. An impedance transformer network (304) couples the RF output of the tap to a rectifier diode (307). The impedance transformer network (304) comprises a capacitor (305) and an inductor (306). The impedance is designed to be such a large value that it does not substantially degrade the return loss of the RF amplifier module. The rectifier diode (307) produces a pulsating DC voltage from the sample of the RF input signal, which is then filtered by a filter capacitor (309). A series resistor (308) provides current limiting.

As the level of RF input power increases, so does the amplitude of the DC voltage produced. In order to hold the gate bias voltage at a relatively constant level, a zener diode (310) is used to limit this DC voltage level. The DC voltage is applied to the RF amplifier module (314) through a coupling resistor (311). A temperature compensation network (315) is employed to reduce the DC voltage in response to an over-temperature condition.

The primary RF input signal to the RF amplifier module is directed through the transmission line (302) into a matching network (312). In the preferred embodiment, since the RF power amplifier module (314) comprises two enhancement mode MOSFETs (Metal-Oxide-Semiconductor Field Effect Transistors) the matching network (312), in addition to providing a proper impedance match, transforms the single-ended input into a double-ended output. The DC bias voltage provided through the coupling resistor (311) is applied to the center tap of the transformer's secondary, which in turn provides a DC path to the gates (313) of the transistors in the power amplifier module (314). In the circuit of the preferred embodiment, relatively constant DC bias voltage is obtained over an input power range of from 2 to 6 Watts.

Figure 4:
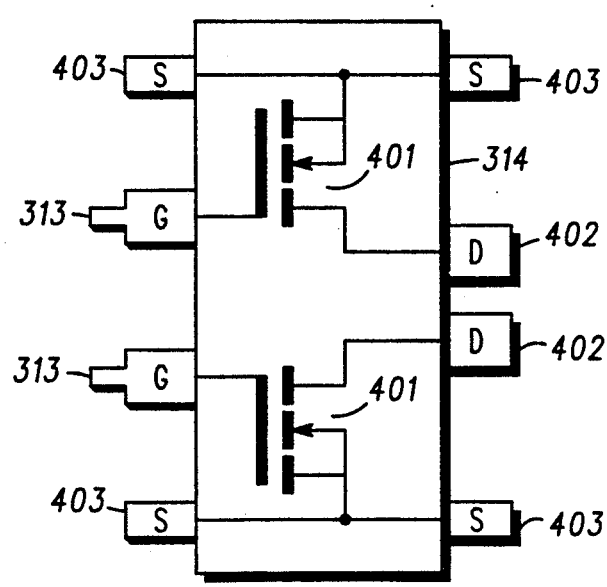
FIG. 4 illustrates an RF power amplifier module including two n-channel enhancement mode MOSFETs.

The connections of the enhancement mode MOSFETs (401) described above to the terminals of the RF power amplifier module (314) are illustrated in FIG. 4. The gate electrodes of the MOSFETs (401) are connected to the gate terminals (313) of the RF power amplifier module (314). The drain regions of the MOSFETs (401) connect to the external drain terminals (402). Two separate source terminals (403) are provided for each MOSFET (401), as shown.

What is claimed is:

1. A circuit for providing bias voltage to at least one amplifier transistor having an RF input signal, the circuit comprising:

RF power divider means for providing a sample of the RF input signal;

rectifier means for converting the sample into a DC voltage;

regulator means responsive to the rectifier means for providing the bias voltage and limiting amplitude to ensure a relatively constant bias voltage over a relatively wide range of RF input signal amplitudes.

2. The circuit in accordance with claim 1, wherein said at least one amplifier transistor is a MOSFET.

3. The circuit in accordance with claim 2, wherein the MOSFET is an enhancement mode MOSFET.

4. The circuit in accordance with claim 1, wherein the RF power divider means comprises a tapped microstrip transmission line.

5. A method for providing bias voltage to at least one amplifier transistor having an RF input signal, the method comprising:
   (a) providing a sample of the RF input signal;
   (b) converting the sample into a DC voltage; and
   (c) regulating the DC voltage to provide the bias voltage and to ensure a relatively constant bias voltage over a relatively wide range of RF input signal amplitudes.

6. For a MOSFET RF power amplifier stage having an RF input signal, a method for providing an RF driven gate bias voltage derived from the RF input signal, the method comprising:
   (a) sampling the RF input signal to provide a sampled signal;
   (b) rectifying the sampled signal to provide a pulsating DC voltage;
   (c) filtering the pulsating DC voltage to provide a filtered DC voltage; and
   (d) regulating the filtered DC voltage to provide the RF driven gate bias voltage.

* * * * *